United States Patent
Egger et al.

(10) Patent No.: US 11,419,247 B2
(45) Date of Patent: Aug. 16, 2022

(54) CONTROLLING A WORKING CONDITION OF ELECTRONIC DEVICES

(71) Applicant: KYNDRYL, INC., New York, NY (US)

(72) Inventors: Michael Egger, Niederwil (CH); Toby Zenerino, Gachnang (CH); Christian Eggenberger, Wil (CH); Joerg Kauke, Brugg (CH); Dario Bindi, Geroldswil (CH)

(73) Assignee: KYNDRYL, INC., New York, NY (US)

( * ) Notice: Subject to any disclaimer, the term of this patent is extended or adjusted under 35 U.S.C. 154(b) by 372 days.

(21) Appl. No.: 16/829,513

(22) Filed: Mar. 25, 2020

(65) Prior Publication Data

US 2021/0307211 A1  Sep. 30, 2021

(51) Int. Cl.
*H05K 7/20* (2006.01)
*G06N 20/00* (2019.01)
(Continued)

(52) U.S. Cl.
CPC ....... *H05K 7/20836* (2013.01); *G05B 13/027* (2013.01); *G06N 7/005* (2013.01); *G06N 20/00* (2019.01)

(58) Field of Classification Search
CPC .. H05K 7/20836; G05B 13/027; G06N 7/005; G06N 20/00; G06N 3/0445; G06N 3/084
See application file for complete search history.

(56) References Cited

U.S. PATENT DOCUMENTS

| 7,644,051 B1 | 1/2010 | Moore |
| 7,867,070 B2 | 1/2011 | Day |

(Continued)

FOREIGN PATENT DOCUMENTS

| CN | 106933719 A | 7/2017 |
| EP | 2495501 A2 | 9/2012 |

(Continued)

OTHER PUBLICATIONS

Lee, et al., "Deep Learning-Based Corporate Performance Prediction Model Considering Technical Capability", Sustainability 2017, 9, 899; doi:10.3390/su9060899, May 26, 2017,12 pages, <https://www.mdpi.com/2071-1050/9/6/899/pdf>.

*Primary Examiner* — Walli Z Butt
(74) *Attorney, Agent, or Firm* — Erik Swanson; Andrew M. Calderon; Roberts Calderon Safran & Cole P.C.

(57) ABSTRACT

An approach for controlling a working condition of electronic devices via controlling a climate parameter. The approach comprises measuring a climate parameter distribution; feeding the climate parameter distribution to a climate control system; obtaining operational data from each of the electronic devices; feeding the operational data into the climate control system to determine control actions; obtaining activity data about external activities; providing a machine learning algorithm trained with past activity data; feeding new activity data to the machine learning algorithm; feeding the prediction output to the climate control system; generating a current climate map; generating a target climate map; and generating a rearrangement plan with rearrangement steps for the electronic devices.

20 Claims, 12 Drawing Sheets

(51) Int. Cl.
  *G06N 7/00*    (2006.01)
  *G05B 13/02*   (2006.01)

(56) References Cited

U.S. PATENT DOCUMENTS

| | | | |
|---|---|---|---|
| 8,180,495 | B1 | 5/2012 | Roy |
| 8,498,114 | B2 | 7/2013 | Martini |
| 8,684,802 | B1 | 4/2014 | Gross |
| 8,762,522 | B2 | 6/2014 | Moon |
| 8,984,906 | B2 | 3/2015 | Tozer |
| 9,146,544 | B2 | 9/2015 | Bentivegna |
| 9,709,965 | B2 | 7/2017 | Slessman |
| 9,996,092 | B2 | 6/2018 | Demetriou |
| 10,180,261 | B1 | 1/2019 | Ross |
| 11,190,918 | B1 * | 11/2021 | Lingle .................... H02J 50/00 |
| 2005/0011208 | A1 | 1/2005 | Dobbs |
| 2006/0168975 | A1 | 8/2006 | Malone |
| 2010/0082178 | A1 | 4/2010 | Dawson |
| 2010/0299099 | A1 | 11/2010 | Yamaoka |
| 2011/0054701 | A1 | 3/2011 | Wang |
| 2012/0109404 | A1 * | 5/2012 | Pandey .................... H04L 67/12 700/275 |
| 2012/0123595 | A1 * | 5/2012 | Bower, III ......... H05K 7/20772 700/282 |
| 2013/0166241 | A1 * | 6/2013 | Hamann ................. G06Q 10/06 702/99 |
| 2013/0317654 | A1 | 11/2013 | Kashirajima |
| 2014/0316720 | A1 | 10/2014 | Dumontier |
| 2014/0320308 | A1 | 10/2014 | Lewis |
| 2015/0371244 | A1 | 12/2015 | Neuse |
| 2016/0073555 | A1 | 3/2016 | Shrivastava |
| 2017/0329384 | A1 | 11/2017 | Ghose |
| 2018/0039717 | A1 * | 2/2018 | Bak ......................... G06F 30/20 |

FOREIGN PATENT DOCUMENTS

| | | | |
|---|---|---|---|
| WO | 2006028846 A1 | 3/2006 | |
| WO | WO-2013095494 A1 * | 6/2013 | ............. G01F 1/708 |
| WO | 2013128468 A2 | 9/2013 | |
| WO | 2015187475 A1 | 12/2015 | |

* cited by examiner

Fig. 12

CONTROLLING A WORKING CONDITION OF ELECTRONIC DEVICES

TECHNICAL FIELD

The present invention relates in general to data processing systems, in particular, to controlling a working condition of electronic devices via controlling a climate parameter.

BACKGROUND

Rack based electronic devices generate different outgoing heat depending on load and construction of the electronic devices and/or the mounting places in the rack.

The installed electronic devices of a data center are normally replaced, planned or unplanned, partially or completely, during their life cycle. Examples of electronic devices are servers, storage or network devices that regularly reach the end of their planned lifespan. These devices may be replaced by modern or more suitable electronic devices.

Parts of e.g. servers, storage or network devices fail or show initial anomalies and are therefore replaced prematurely with components that may have other thermal manufacturer specifications, such as cooling units, or due to the replacement of hard disks with flash cards, respectively SSDs.

Modifications may be carried out in a data center. On the one hand, changes can be made to the data center, e.g. in which the air conditioning system is renewed, the floor plan of an outsourcing center must be adapted to new clients or new client needs, the capacity and utilization of the IT infrastructure changes, or adaptations to a hot aisle or a cold aisle concept are necessary.

In both use cases, these changes can have a sub-optimal impact on the data center climate, either gradually or on a large scale.

SUMMARY

According to an embodiment of the present invention, a method for controlling a working condition of electronic devices via controlling a climate parameter, the method comprising: measuring a climate parameter distribution by an array of climate sensors arranged in vicinity of an array of the electronic devices; feeding the climate parameter distribution to a climate control system and controlling by the climate control system the climate parameter by providing a controllable fluid stream of a cooling fluid towards the electronic devices; obtaining operational data from the electronic devices, representing working conditions based on workloads, and based on the climate parameter affecting the electronic devices; feeding the operational data into the climate control system to determine control actions to be executed to control the working condition of the electronic devices by controlling the climate parameter; obtaining activity data about external activities influencing the workload processed by the electronic devices; providing a machine learning algorithm trained with past activity data, thereby having learned to derive from the activity data an expectable workload for the electronic devices being expectable in a predetermined time window after the external activities; feeding new activity data to the machine learning algorithm, and obtaining from the machine learning algorithm a prediction output regarding the expectable workload for the electronic devices, in a predetermined time window; feeding the prediction output to the climate control system as additional input for controlling the climate parameter in the predetermined time window; generating a current climate map, the current climate map reflecting a climate profile across the array of the electronic devices, obtained via the controlled climate parameters; generating a target climate map, the target climate map being obtainable via rearranging the electronic devices, wherein the target climate map represents a workload and climate conditions matching the current climate map at a reduced power consumption over a predetermined second time window; and generating a rearrangement plan, comprising rearrangement steps for the electronic devices, required when starting from the current climate map to arrive at the target climate map.

According to an embodiment of the present invention, a computer program product for controlling a working condition of electronic devices via controlling a climate parameter, the computer program product comprising: a computer readable storage medium having program instructions embodied therewith, the program instructions executable by a computer system to cause the computer system to perform a method comprising: measuring climate parameters by an array of climate sensors arranged in vicinity of an array of the electronic devices; feeding the climate parameters to a climate control system and controlling, by the climate control system, the climate parameters by providing a controllable fluid stream of a cooling fluid towards the electronic devices; obtaining operational data from the electronic devices, representing working conditions based on workloads, and based on the climate parameters affecting the electronic devices; feeding the operational data into the climate control system to determine control actions to be executed to control the working condition of the electronic devices by controlling the climate parameters; obtaining activity data about external activities influencing the workload processed by the electronic devices; providing a machine learning algorithm trained with past activity data, thereby having learned to derive from the activity data expectable workloads for the electronic devices being expectable in a predetermined time window after external activity; feeding new activity data to the machine learning algorithm, and obtaining from the machine learning algorithm a prediction output regarding the expectable workload for the electronic devices, in a predetermined time window; feeding the prediction output to the climate control system as additional input for controlling the climate parameters in the predetermined time window; generating a current climate map, the current climate map reflecting a climate profile across the array of the electronic devices, obtained via the climate parameters; generating a target climate map, the target climate map being obtainable via rearranging the electronic devices, wherein the target climate map represents workloads with climate conditions matching the current climate map at a reduced power consumption over a predetermined second time window; and generating a rearrangement plan, comprising rearrangement steps for the electronic devices, required when starting from the current climate map to arrive at the target climate map.

According to an embodiment of the present invention, a data processing system for execution of a data processing program comprising computer readable program instructions for performing a method according to claim 1.

BRIEF DESCRIPTION OF THE SEVERAL VIEWS OF THE DRAWINGS

The present invention together with the above-mentioned and other objects and advantages may best be understood from the following detailed description of the embodiments, but not restricted to the embodiments.

FIG. 12 depicts the process for changing the temperature distribution in the rack by changing the air inlets in the base plate according to an embodiment of the invention.

DETAILED DESCRIPTION

Figure 1:
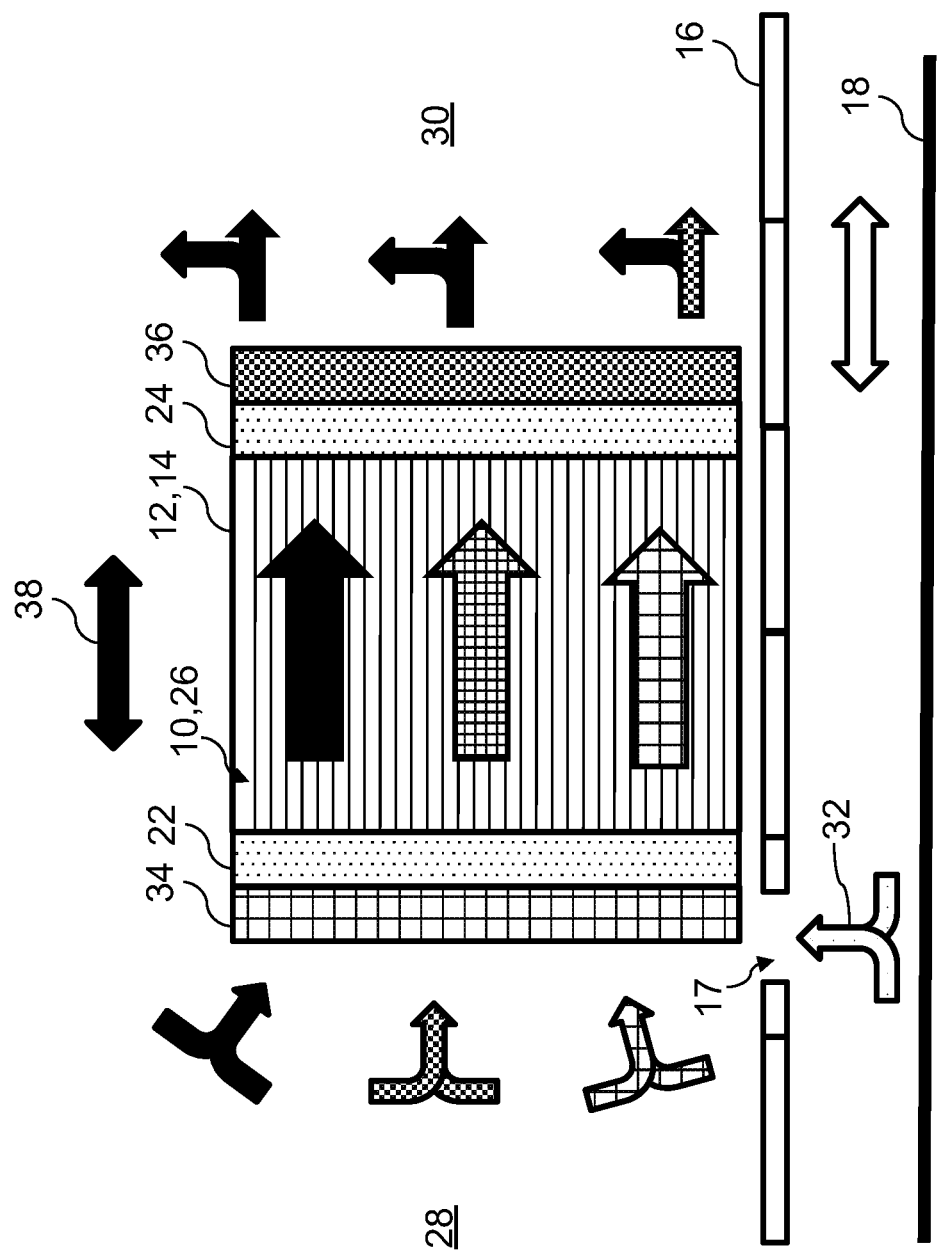
FIG. 1 depicts a schematic air flow in a raised floor environment with cold air supply for cooling of a rack with installed electronic devices.

In the drawings, like elements are referred to with equal reference numerals. The drawings are merely schematic representations, not intended to portray specific parameters of the invention. Moreover, the drawings are intended to depict only typical embodiments of the invention and therefore should not be considered as limiting the scope of the invention.

The illustrative embodiments described herein provide for controlling a working condition of electronic devices via controlling a climate parameter.

The illustrative embodiments may comprise: (i) measuring a climate parameter distribution by an array of climate sensors arranged in vicinity of an array of the electronic devices; (ii) feeding the climate parameter distribution to a climate control system and controlling by the climate control system the climate parameter by providing a controllable fluid stream of a cooling fluid towards the electronic devices; (iii) obtaining operational data from the electronic devices, representing their working condition based on their workload, and based on the climate parameter affecting the electronic device; (iv) feeding the operational data into the climate control system to determine control actions to be executed to control the working condition of the electronic devices by controlling the climate parameter; (v) obtaining activity data about external activities influencing the workload processed by the electronic devices; (vi) providing a machine learning algorithm trained with past activity data, thereby having learned to derive from the activity data the expectable workload for the electronic devices being expectable in a predetermined time window after the external activity; (vii) feeding new activity data to the machine learning algorithm, and obtaining from the machine learning algorithm a prediction output regarding the expectable workload for the electronic devices, in a predetermined time window; (viii) feeding the prediction output to the climate control system as additional input for controlling the climate parameter in the predetermined time window; (ix) generating a current climate map, the current climate map reflecting a climate profile across the array of the electronic devices, obtained via the controlled climate parameters; (x) generating a target climate map, the target climate map being obtainable via rearranging the electronic devices, where the target climate map represents essentially the same workload with essentially the same climate conditions as the current climate map at a reduced power consumption over a predetermined second time window; and (xi) generating a rearrangement plan, comprising rearrangement steps for the electronic devices, required when starting from the current climate map to arrive at the target climate map.

The illustrative embodiments are sometimes described herein using particular technologies only as an example for the clarity of the description.

FIG. 1 depicts a schematic air flow in a raised floor environment with cold air supply for cooling of a rack 14 with installed electronic devices 10 according to state of the art.

Electronic devices 10 are usually installed in data centers as an array 12 in rack units 26, marked as solid lines, in a 19-inch electronic device rack 14. Electronic device may be used as synonym for all electronic devices or components that can be installed in an electronic device rack 14: servers, network components, UPS, storage, etc. These racks 14 are divided into standardized Unit-Height (Rack Units, RU), shown in FIG. 1 as horizontal inserts schematically marked by black lines. A defined height of a rack unit can be 1¾ inch, i.e. 44.45 millimeters.

For the necessary cooling of the electronic devices 10, cold air is forced by an air conditioner (CRAC=Computer Room Air Conditioner) into the raised floor, a so-called cold air raised floor, which is led into the room in front of an electronic device rack 14 through an opening in the ground plates 16 as air inlet 17. Ideally, the racks 14 should be positioned so that there are "Cold Aisle" zones 28 and "Hot Aisle" zones 30 within a data center. In FIG. 1 air flow 32 is shown with arrows, which vary according to the temperature from white (colder) to black (warmer).

Due to the overpressure in the raised floor between the ground floor 18 and the ground plates 16, the cold air is directed upwards in front of the electronic device rack 14. In the space in front of the racks 14, ambient air and chilled air is mixing. The supplied cold air cools the electronic devices 10 in the rack 14, the supplied air warms up due to the heat dispersion and is passed on in the direction of the "Hot Aisle" zone 30. The warm outgoing air is absorbed by one or multiple CRACs and then cooled and returned to the raised floor.

According to state of the art, a circuit is created, the cool air is supplied uncontrolled in the raised floor by the CRAC and the heated air is absorbed from the upper part of the room, where it is collected by natural convection. The volume flow of the cooling air is usually not actively controlled in a fine-granular manner on the rack level.

Some data centers also use so-called housing. This means that the air flow is led into an additional "encapsulated" room within the data center equipped with one or more racks 14. The scheme in FIG. 1 will then be available several times per computer encapsulated room.

A data center usually has one or more racks 14 or housings, each with a cooling air supply.

FIG. 1 assumes a typical cooling-air circuit according to state of the art. The cold air flows through the raised floor and then by an overpressure from the floor towards the ceiling. Next, it is mixed with surrounding air in the "Cold Aisle" zone 28 and led through the rack 14 or racks, more precisely their electronic devices, into the "Hot Aisle" zone 30. Recirculation 38 takes place from the "Hot Aisle" zone 30 to the cold aisle zone to a certain degree. The air distribution on the rack intake side, the front air flow 34 entering through the front rack door 22, is not necessarily homogeneous and can vary substantially depending on the type of equipment used or due to assembly errors, e.g. the installation may be rotated horizontally by 180 degrees, such that the front rack door 22 with the front air flow 34 is changed to the rear rack door 24 with the rear air flow 36.

The configured overpressure and the cooling air temperature level within the raised floor are selected in such a way that enough cooling energy is available even in the most unfavorable operating conditions. The cooling system is oversized for normal operation and is a resource guzzler in every respect.

Figure 2:
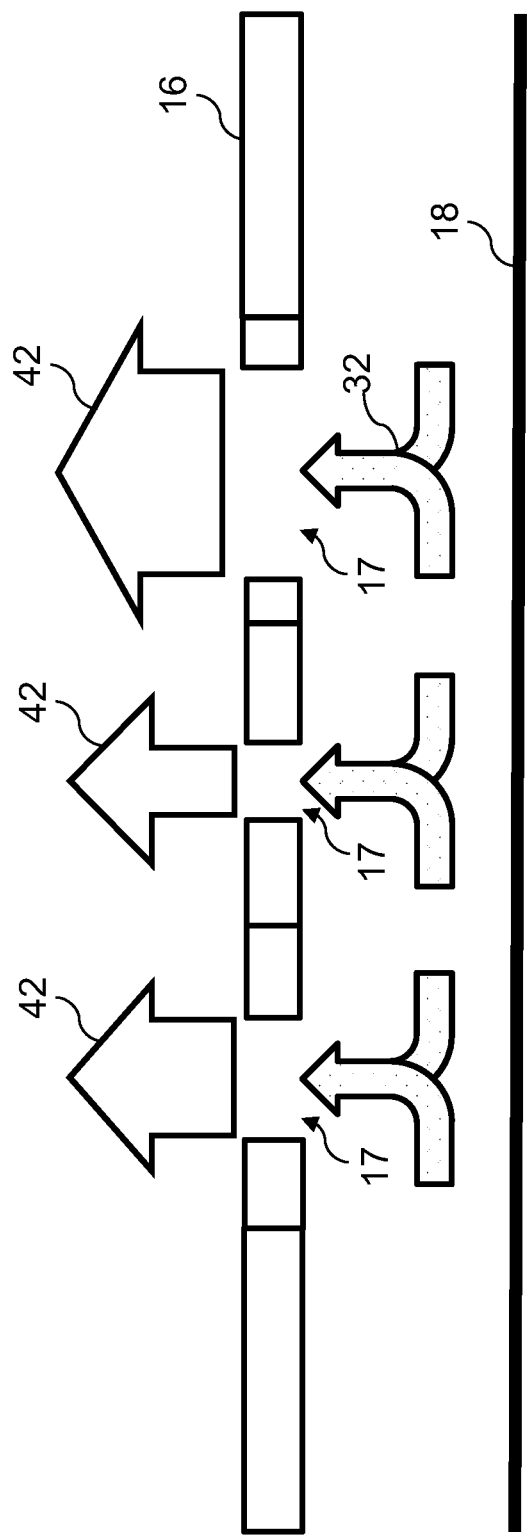
FIG. 2 depicts different size air inlets in the base plates for supplying the racks with cold air.

In the best-case, this opening(s) in the raised floor is (are) dimensioned so that each electronic device 10 in the rack 14 can be operated in the recommended temperature range, as shown in FIG. 2.

FIG. 2 depicts different size air inlets 17 in the ground plates 16 for supplying the racks 14 with cold air. Different air volumes 42 due to different size air inlets 17 are exemplified with different size arrows.

The required cooling of the electronic devices 10 is strongly load dependent: the more work an electronic device must do, the more cooling power is needed to operate the electronic device hardware in an "optimal" temperature range. The electronic device 10 itself actively regulates its fan speeds and adapts to the various load conditions (idle vs. full load). The air inlets 17 cut into the ground plates 16 will therefore have been designed for the maximum required cooling air volume flow.

To meet all variable electronic device load conditions and manufacturer specifications regarding the permitted or recommended operating temperature ranges, the cooling energy is oversized to a maximum load plus possibly a safety reserve. As a result, the costs for processing the cooling air are correspondingly high. This results in high operating costs, increased energy consumption and, depending on how the energy was generated, higher emissions.

Electronic devices 10 usually have two environments for operation: The "recommended temperature ranges", as well as the "allowed temperature ranges". The "recommended temperature range" will ensure the highest availability of the electronic devices 10. The "allowed temperature range" allows operation within the manufacturer's warranty with a lower expected availability. Operation outside this range is not permitted. In case of non-compliance, the warranty expires and the probability of failure increases.

Figure 3:
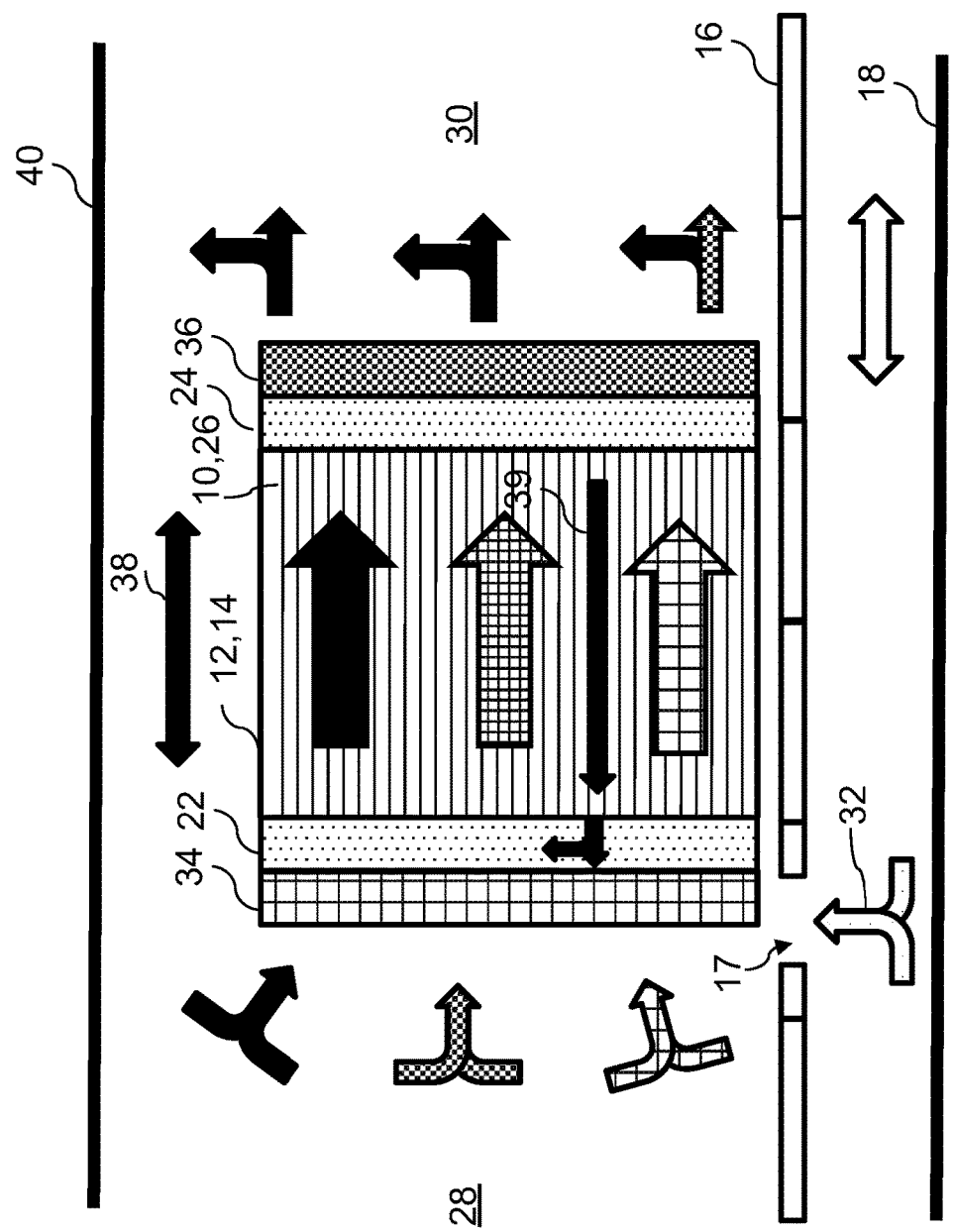
FIG. 3 depicts a cooling circuit according to FIG. 1 with possible anomalies due to incorrectly installed electronic devices or a too low ceiling.

FIG. 3 depicts a cooling circuit according to FIG. 1 with possible anomalies due to incorrectly installed electronic devices 10 or a too low ceiling 40.

There are other situations with "anomalies", when individual electronic devices or entire racks generate an undesired airflow (e.g. 180 degree backwards). This can result in a too warm and possibly harmful airflow for the other electronic devices 10. This is shown in FIG. 3 by recirculation flows 38 above the low ceiling. A further anomaly may occur if a warm outgoing air flow is misdirected and a recirculation 39 from "Hot Aisle" zone 30 directly to "Cold Aisle" zone 28 takes place. Here warm exhaust air will mix with cool supply air and lead to the fact that the supplied cooling air flow must be increased to obtain an "optimal environment" for the affected electronic devices 10. The result is a self-sustaining circuit of ever warmer supply air, which at best leads to critical operating temperatures in the electronic devices. The described anomaly can also be influenced by interactions between racks 14 or objects of any kind, such as solid, liquid, in different dimensions, etc.

Another possibility is that the openings in the ground plates 16 are too small for the required cooling of the installed electronic devices 10. This occurs when, for example, more powerful new electronic devices 10 are installed in one or more racks, but the ground plates 16 have not been adapted to the new requirements. Manual redesign and readjustments of the air dampening devices/tiles is required to restore a healthy electronic device environment.

Figure 4:
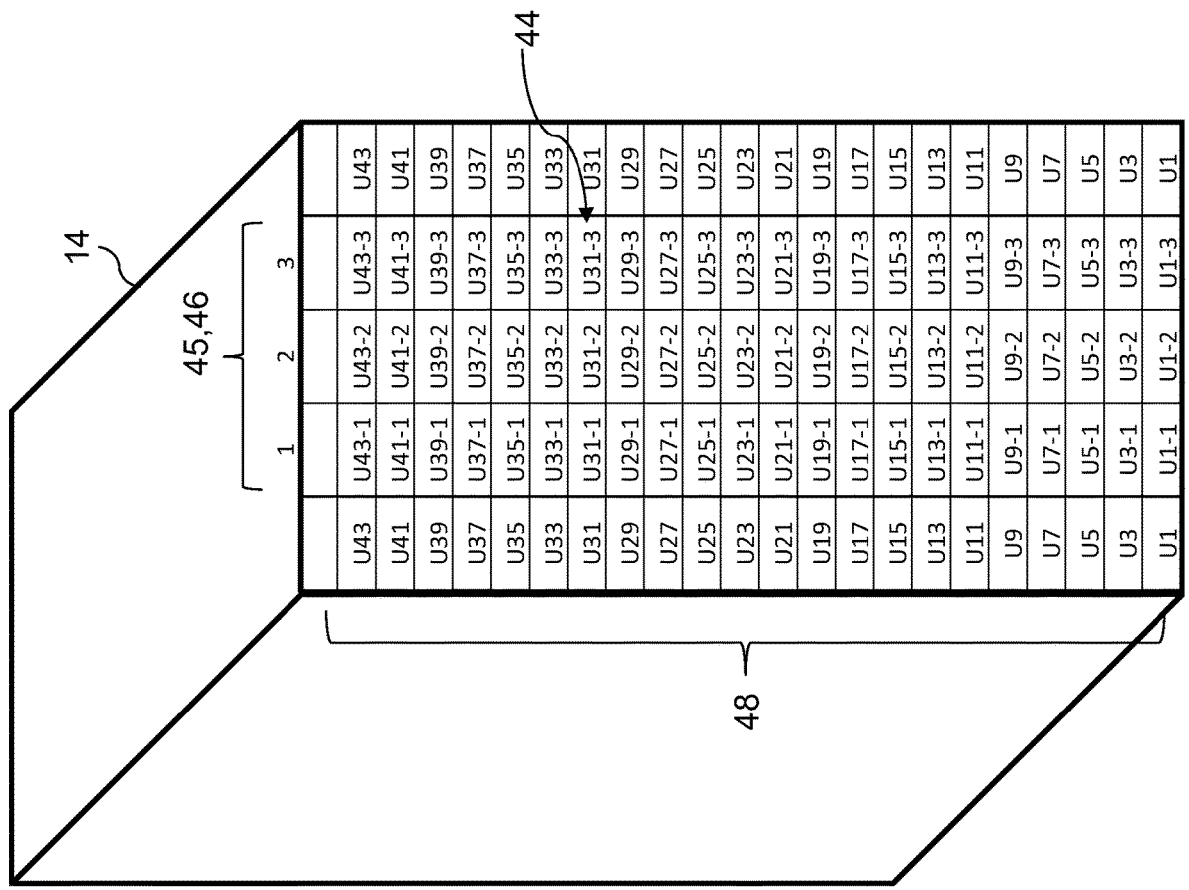
FIG. 4 depicts an arrangement of climate sensors in a rack in three columns and in two unit-heights of the rack according to an embodiment of the invention.

FIG. 4 depicts an arrangement of climate sensors 44 in a rack 14 in three columns as individual climate sensor positions 46 and in two unit-heights 48 of the rack according to an embodiment of the invention. Unit-heights 48 are marked by the columns U1 to U43 in steps of two.

According to embodiments of the invention a mesh-like sensor array 45 of temperature sensors may be provided that can detect the incoming cooling air temperature more precisely at different heights in one or more racks 14 or on any surface. This permits precise determination of the actual cooling requirement of the entire area as well as of the installed electronic devices 10 or objects. For a dynamic supply of the required cooling air volume flow, the base plates in front of the areas to be measured (e.g. racks 14) are provided with an actively variable supply air damper 20, depicted schematically in FIG. 10. This way it is managed actively that there is just as much cooling air as needed to reach the most economical operating point of the cooling. This means that the maximum cooling capacity does not have to be provided all the time: The maximum cooling capacity is only required when there is a real need for it.

The integration and entanglement of the cooling air influence and the sensor array 45, shown in FIG. 4, allows a cooling of the electronic devices 10, depicted schematically in FIGS. 1 and 3 as solid lines in different unit heights, according to demand, regardless of the load conditions of the systems.

The climate parameter distribution 51 is measured by providing climate sensors 44 at different locations across the array 12 of electronic devices 10, in particular in a mesh-like array of climate sensors 44.

The climate sensors 44, which cover the entire front surface of the rack 14 as a mesh, can be used to record information about error conditions that could not be recorded without the measured values or with only individual climate sensors 44. In this way, it can be determined whether there is recirculation of warm outgoing air, where exactly it occurs and how it influences operation. The permanent recording and storage of the data allows learning of normal states and based on the normal states, extraordinary states can be derived. This enables agnostic detection of failures in the data center layout, individual rack layouts, or device assembly manufacturers.

FIG. 4 shows an example configuration with 66 climate sensors 44 per 42 U rack 14. This allows a precise assessment of the supply air temperature in steps of two Unit-Heights over the entire rack 14 front surface.

Climate sensors 44 may be placed in one or more columns on the front side of the surface to be examined. One or more climate sensors 44 may be mounted horizontally, evenly distributed, at a distance of two Unit-Heights (2 U, 88.9 mm). The distance and distribution of the climate sensors 44 can vary according to the purpose.

The climate sensors 44 can be installed in a frame which is mounted in the racks 14 or in front of the racks 14. It is also conceivable to integrate the sensors in the doors or as an autonomous grid. The frame is height adjustable and can be adjusted for different scenarios. The number of climate sensors 44 varies according to the requirements. Climate sensors 44 can receive a unique identification number, consisting of the sensor position (Uxx) and the corresponding column, for example, Sensor U23-1.

This rack 14 example could be a representative, but not exclusive, of a refrigerated shelf, a cold storehouse, a wine cellar, a wine cabinet, a multi-zone barbecue smoker, or a measurement relevant situation. The climate sensors 44 could also be replaced or supplemented for other application examples such as humidity, air flow, acoustic, vibration, gas, particle or other sensors.

The climate sensor 44 readings are retrieved by a recording device at regular intervals. The readout time, the measured values and the corresponding climate sensor 44 positions are stored for further processing.

A heat map can be created from the collected data, which outputs a measured temperature value for the climate sensor 44 positions in each array. The different values are assigned specific characteristics (e.g. colors) for easier evaluation. The color scale can be chosen so that a simple visual assessment by a human being is possible.

The stored values are compared with the recommended and approved specifications of the manufacturer or best practice. If it is determined that the maximum values of the "recommended temperature range" have not been reached, e.g. 25° C. measured and compared with 27° C. maximum recommended temperature (see FIG. 5), this deviation value is transferred to the next step.

Anomalies in the working condition and/or failures of the electronic devices 10 may be determined by evaluating the measured climate parameter distribution 51.

Figure 5:
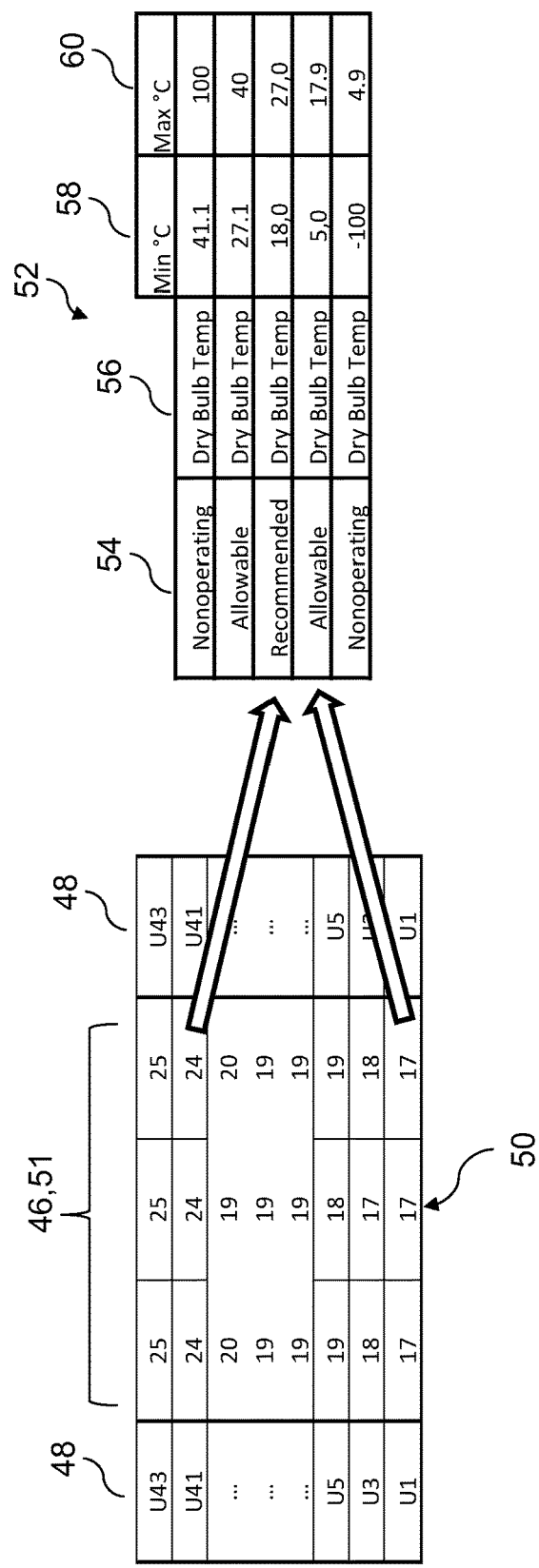
FIG. 5 depicts a comparison of measured climate parameter distribution and manufacturer specifications for electronic devices.

FIG. 5 depicts a comparison of measured climate parameter distribution 51 and manufacturer specifications 52 for electronic devices 10. Climate parameters 50 are indicated at the respective climate sensor 44 positions 46 in unit-heights 48. The measured values are categorized according to manufacturer specifications 52 concerning recommendations 54, conditions 56 and specified minimum temperatures 58 and maximum temperatures 60.

The dense climate sensor 44 mesh makes it possible to identify potential failure sources that would not be possible with a conventional room temperature measurement on the one hand and a purely isolated, electronic device-based measurement on the other. Thus, it is conceivable to detect unwanted warm air re-circulation in or at the measuring points and to specifically indicate the location and time of this anomaly. The patterns can be used to learn and recognize which states are normal and which fall outside the expected values.

The fine-meshed climate sensor 44 grid not only allows statements to be made about the surroundings at different heights, but also an assessment as to whether there are deviations at the same height, on all sides or in the middle of the measuring surface.

This can be used to proactively report and initiate repair or air duct adjustment before the affected unit is damaged or malfunctions due to inadequate cooling. This goes hand-in-hand with an increase in energy efficiency.

The measured climate parameter distribution 51 may be continuously compared with manufacturer specifications 52 of the electronic devices 10.

Figure 6:
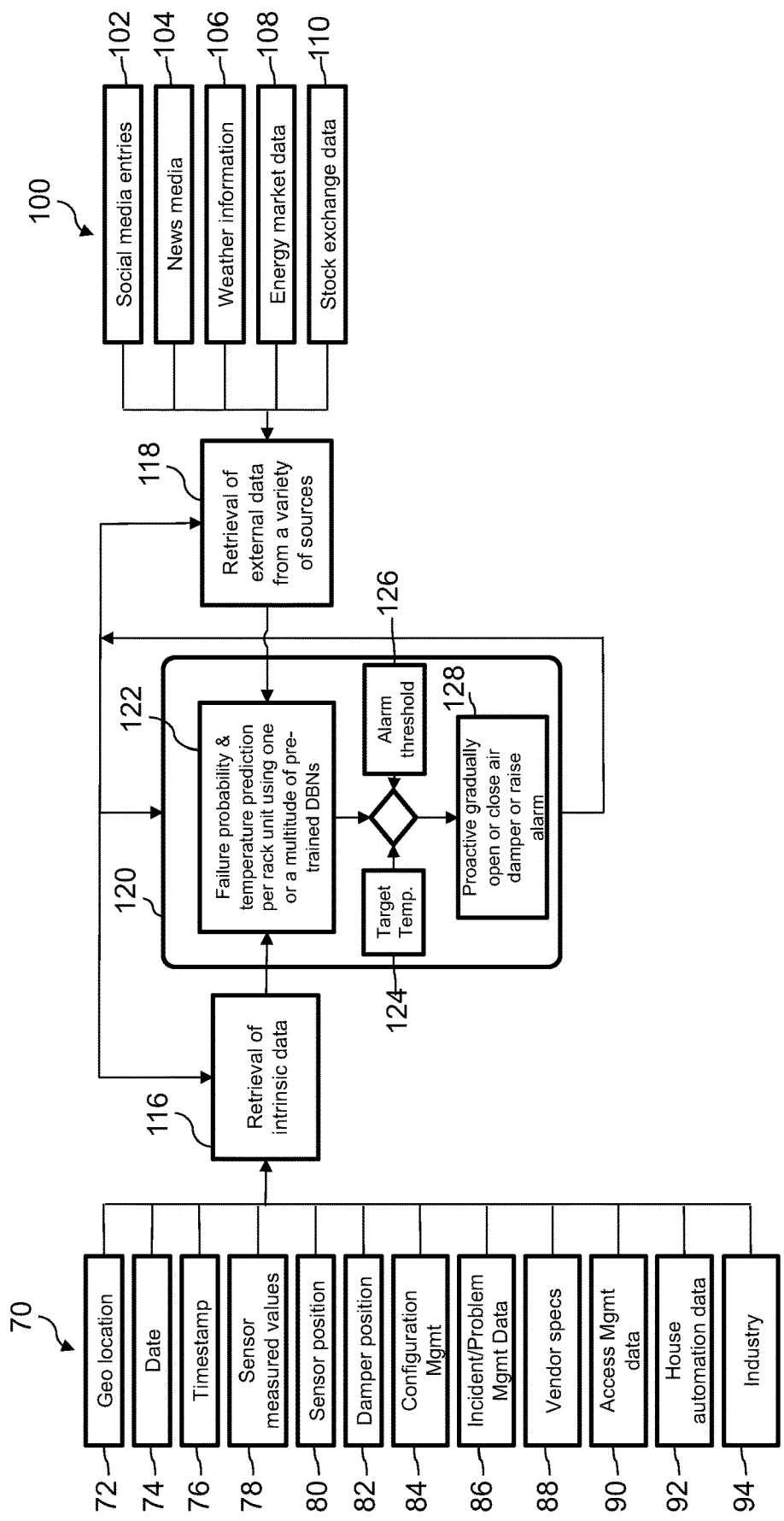
FIG. 6 depicts data sources for a Deep Neural Network based feedback system according to an embodiment of the invention.

FIG. 6 depicts data sources as intrinsic factors 70 and extrinsic factors 100 for a Deep Neural Network based feedback system of a climate control system 120 according to an embodiment of the invention.

Deep Neural Networks (DNN), among others, are suitable for predicting the temperature development in the individual racks and the associated proactive control of the automatically steered floor air damper 20. The position of the air damper 20 can be determined by intrinsic factors 70 and extrinsic factors 100 which are continuously fed to the trained DNN (FIG. 6).

Intrinsic factors 70 can include data that in the broadest sense originates from the data center or directly affect the data center, such as, but not limited to, the geographical location 72 (on land, under water, in the air or in space), which can also change with a mobile (backup data) center, the survey date 74 and the timestamp 76 of the data center status, the sensor measured values 78 captured by the climate sensors 44 attached to the racks 14, the sensor's position 80 within the meshed grid, the damper position 82, configuration management information 84 about the infrastructure in the data center, incident/problem management data 86, i.e., data concerning the infrastructure of the data center, vendor specifications 88 for devices installed in the rack 14, such as, but not limited to, minimum, maximum, and recommended operating temperatures, access management data 90, i.e., data of room access tracking (e.g. door opened by whom), building management system for house automation data 92, i.e., Error messages, blinds control, alarms and the industry 94 in which the devices are used (e.g. devices in the banking sector will have a different load/temperature profile than devices used by the retail sector).

The extrinsic factors 100 include data from the outside world in the broadest sense which directly or indirectly influence the temperature development of the electronic devices 10 in the racks 14, e.g. social media entries 102, which for example strongly influence the transaction volume of securities 110, e.g. stock exchange data, or online purchases. It is also conceivable that news media 104, blogs, messages and discussions about faulty products, or those fueling fears that increase the call volume in call centers, increase the utilization of IT systems and ultimately lead to changes in temperature, could be the cause. Further, weather forecasts 106, which, for various reasons, influence the utilization of the electronic devices 10 in the racks 14, as well as the air conditioners of a data center. Further, the development of supply and demand on the energy markets 108, such as spot market, which, depending on the signs, triggers a proactive reduction or increase in cooling capacity.

Intrinsic factors 70 data and extrinsic factors 100 are retrieved, modules 116 and 118, respectively, to the failure probability and temperature prediction module 122 of the climate control system 120. A target temperature 124 as well as alarm thresholds 126 are further inputs in order to determine predictive control actions 128 to open or close air dampers or to raise an alarm.

As architecture for Natural Language Processing (NLP) and predictions, Deep Belief Networks (DBN), for example, are advantageous. The DBN is a deep multilayer network with many hidden layers.

Figure 7:
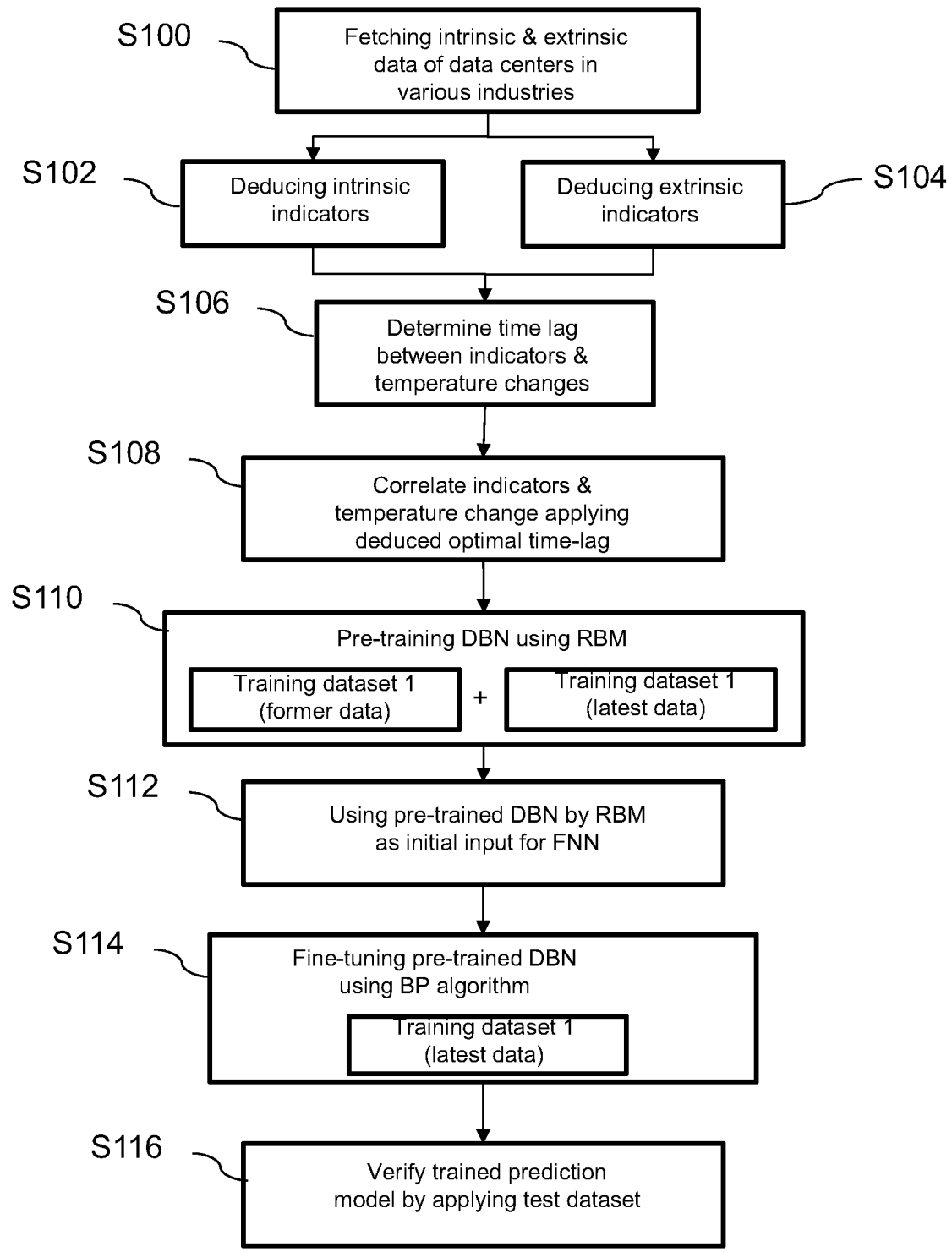
FIG. 7 depicts a flowchart for development, training and testing of the prediction model according to an embodiment of the invention.

FIG. 7 depicts a flowchart for development, training and testing of the prediction model according to an embodiment of the invention.

FIG. 7 shows schematically how the prediction model develops, trains and is verified. Whereby one or more prediction models depending e.g. on the industrial orientation 94 can finally be used.

In the first step S100, intrinsic factor 70 data and extrinsic factor 100 data on one or more data centers in one or more industries are collected over a defined period.

In the following, the data for the defined prediction model (e.g. retail sector) are prepared and derived S102, S104 as indicators 136.

With the relevant and adjusted, intrinsic and extrinsic data sets, typical time-lags can be determined until changes in intrinsic and extrinsic indicators affect the temperature, the humidity etc., step S106.

If these moments of inertia are known, the relevant and adjusted extrinsic data sets as indicators 136 are correlated with the relevant temperatures and air damper positions according to the time lag determined, step S108.

The distribution pattern of when the air dampers should be in which opening position and when an alarm must be triggered in an unfavorable case can be based on unattended learning. A Restricted Boltzmann Machine (RBM) can be pre-trained with complete data sets, step S110, as an input for a feed-forward neural network step S112.

The machine learning algorithm can comprise an architecture for NLP for evaluating the extrinsic factors 100, in particular a DBN.

The machine learning algorithm can be trained with intrinsic factors 70, comprising one or more of at least one of the following (see FIG. 6): a geographic location 72, a date 74, a timestamp 76, a sensor measured value 78, a sensor position 80, a fluid damper position 82, a configuration management 84, incident/problem management data 86, a vendor specification 88, an access management data 90, a house automation data 92, an industry type 94.

Subsequently, the pre-trained neural network can be modified to a general Feed-forward-Neural Network (FNN) using an RBM by adding an output layer before the pre-trained network, step S114. Fine-tuning the machine learning algorithm may comprise a back-propagation algorithm.

The initial values of the parameters of the modified neural network from the second to the visible layer can be replaced by the pre-trained parameters and the parameters of the new output layer can be set to random initial values.

Subsequently, the network parameters can be refined by applying a Back-Propagation algorithm using relatively current training data, step S116, verifying the trained prediction model by applying a test dataset.

The use of current data in the fine-tuning process shows that current trends take precedence in predictions, which can improve the accuracy of predictions of time series data (e.g. position of the air damper).

Failure probabilities and/or a temperature prediction for an array 12 of electronic devices 10 may be determined using one or a multitude of pre-trained DBN.

Figure 9:
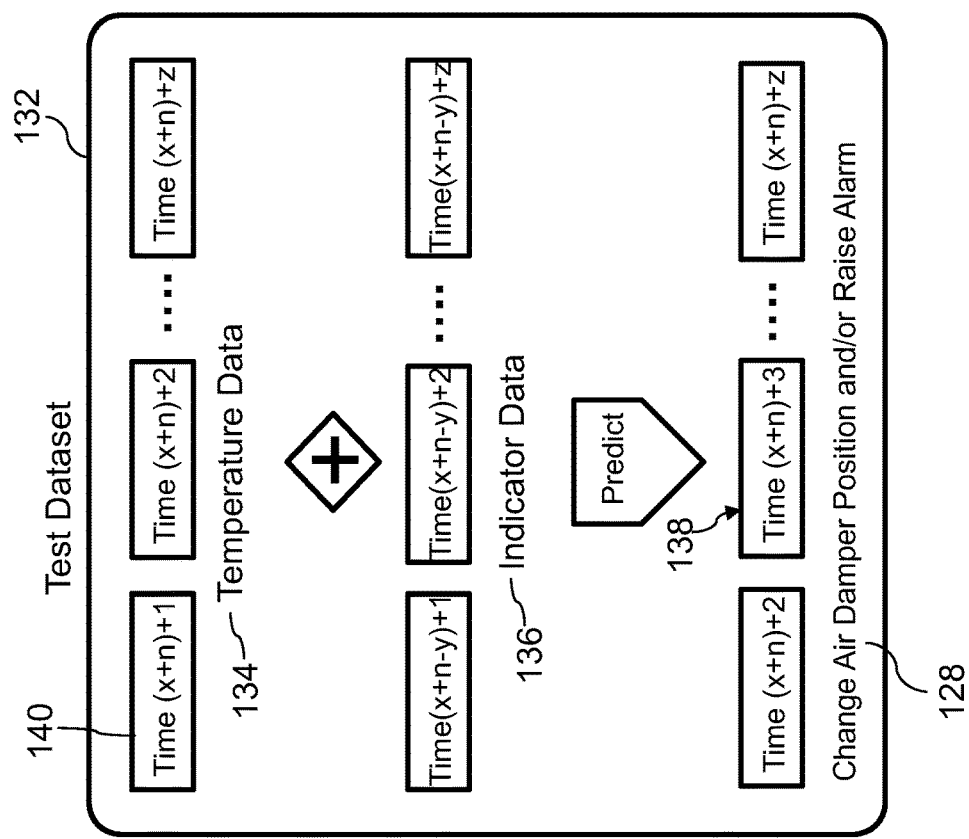
FIG. 9 depicts a verification of prediction quality starting with a test dataset according to an embodiment of the invention.
Figure 8:
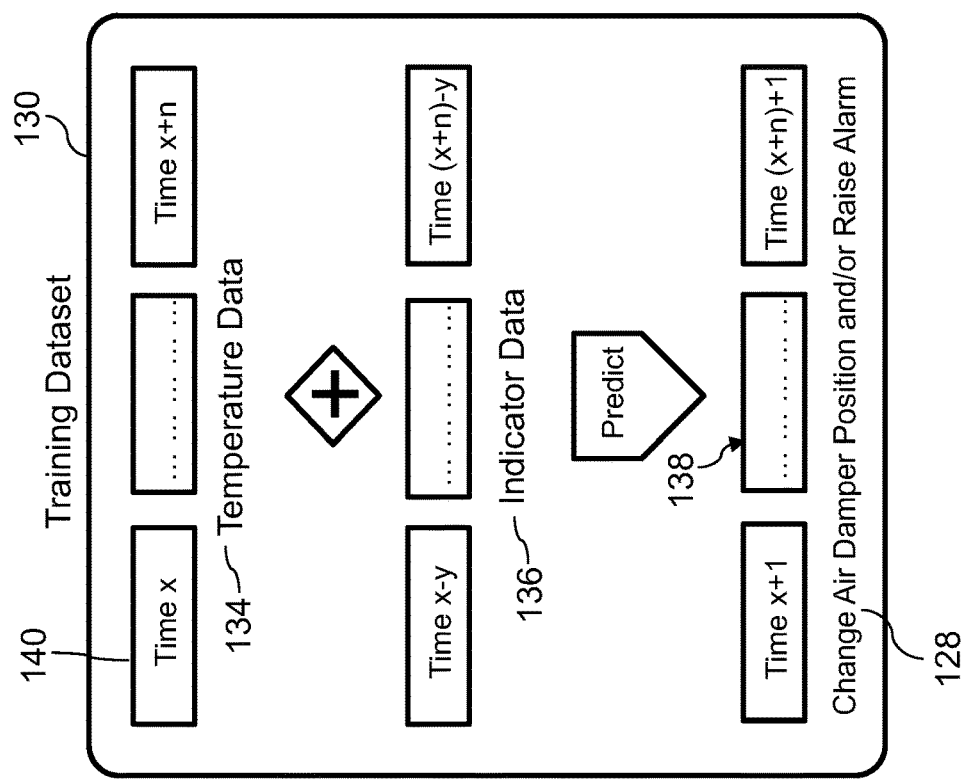
FIG. 8 depicts a training process of a Deep Neural Network with a training dataset according to an embodiment of the invention.

To empirically verify the prediction quality of the proposed model, the temperatures, the humidity etc., air damper positions and probability of an alarm can be predicted using the trained model and compared with a set of test data, which is depicted in FIGS. 8, 9.

FIG. 8 depicts a training process of a Deep Neural Network with a training dataset 130 according to an embodiment of the invention, whereas FIG. 9 depicts a verification of prediction quality starting with a test dataset 132 according to an embodiment of the invention.

In the training process temperature data 134 for predefined time windows 140 can be combined with indicator data 136 in order to predict prediction data 138 specifying e.g. control actions 128.

The climate control system 120 can be put into operation when the required prediction quality has been achieved.

Because of the evaluation from the prior steps, the cooling air volume flow can be adjusted according to the selected control characteristic.

Fluid dampers 20 may be controlled pro-actively and/or an alarm may be raised depending on at least one of the failure probabilities, a temperature prediction, a target temperature, an alarm threshold, etc.

For verifying, a test dataset may be used to feed into the machine learning algorithm. In the verifying process temperature data for predefined time windows 140 can also be combined with indicator data 136 in order to predict prediction data 138 specifying e.g. control actions 128.

Figure 10:
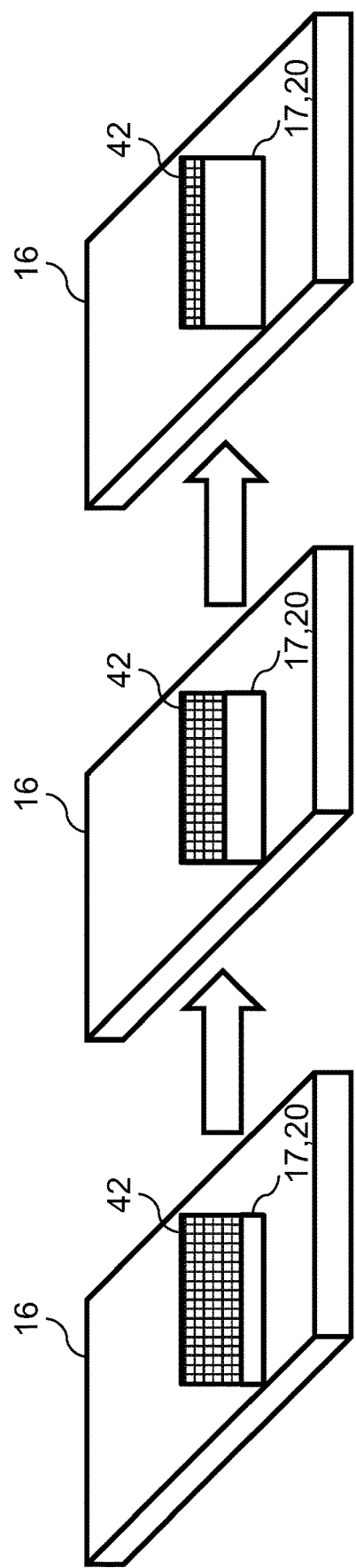
FIG. 10 depicts the process for adjusting the air inlets of the ground plates according to the temperature requirements of the individual unit-height of electronic devices in the server rack according to an embodiment of the invention.

FIG. 10 depicts schematically the process for adjusting the air inlets 17 of the ground plates 16 according to the temperature requirements of the individual unit-height of electronic devices 10 in the electronic device rack 14 according to an embodiment of the invention.

The cooling air volume flow can be controlled by a mechanical damper 20 in the opening of the ground plates 16 in front of the racks 14 to be regulated, which can change the open cross-section of the supply air inlet 17. Depending on the measured values of the sensor array 45, more or less cooling air 42 is supplied to the rack 14.

If the actual value of one or more climate sensors 44 is too low in relation to the maximum recommended manufacturer specification, the supply air volume flow is reduced, and the air inlet 17 of the supply air is reduced (see FIG. 10).

The same applies to: If the actual temperature value is too high and outside the "recommended temperature value", the air inlet 17 is extended. The necessary modification of the air inlet 17 in the ground air damper 20 is carried out by the climate control system 120 in a process of measuring supply air over the entire surface-evaluating-changing the air volume (depicted in FIG. 11) via variable actuators in the "Cold Aisle" floor damper 20 in a first step S1.

Figure 11:
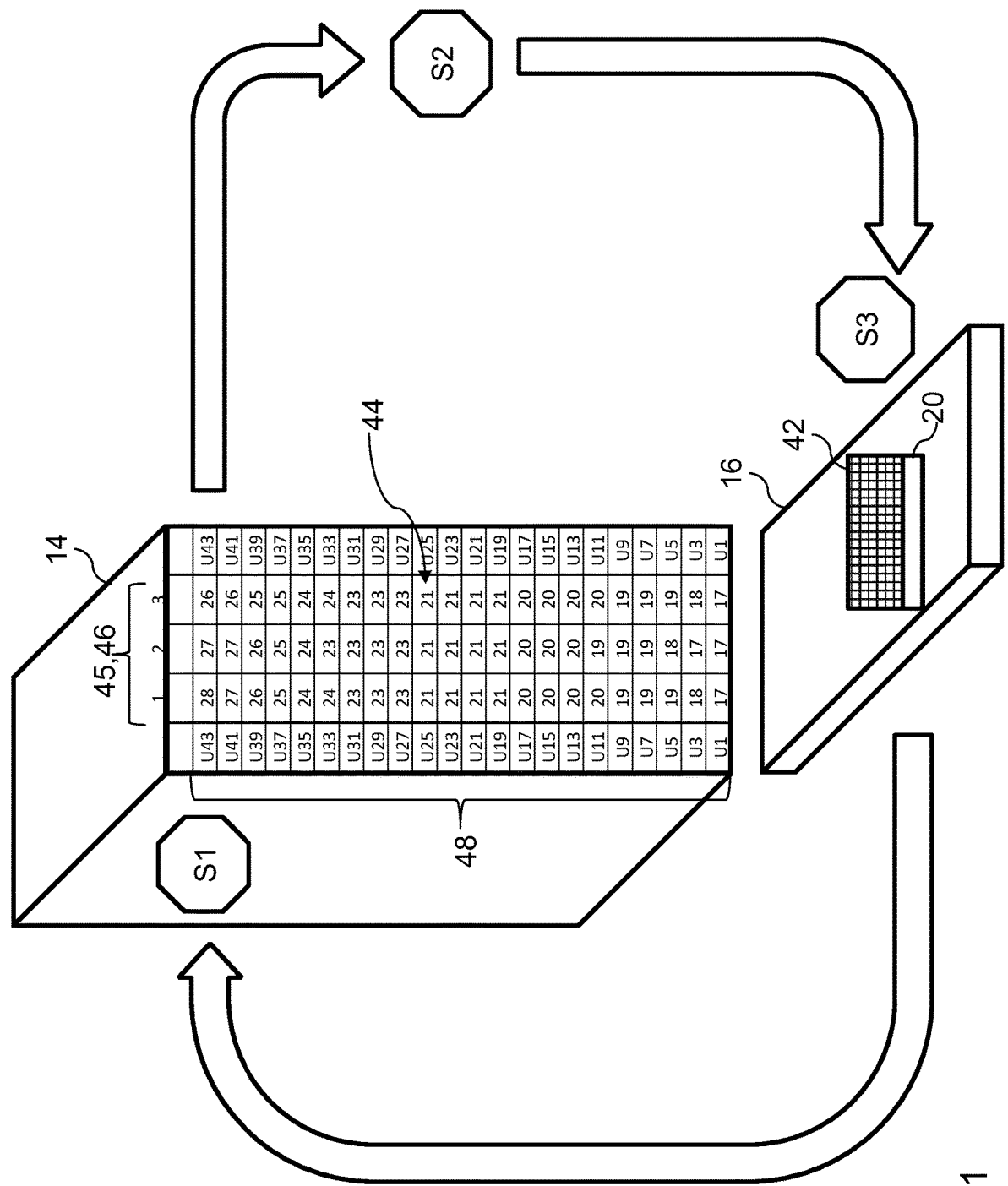
FIG. 11 depicts a process loop for controlling a working condition of electronic devices in a rack via controlling the temperature distribution according to an embodiment of the invention.

FIG. 11 depicts a process loop for controlling a working condition of electronic devices 10 in a rack 14 via controlling the temperature distribution according to an embodiment of the invention.

In step S1 the temperature of the electronic devices 10 is measured. In step S2 the Deep Learning algorithm is applied and in step S3 ground air dampers 20 are adjusted in order to adjust the air volume 42.

The system is continuously checked and, if necessary, further adjusted to achieve the optimum operating range in the specific electronic device rack 14.

The process cycle from step S1 to step S3 is continued continuously with the aim to keep all sensor values in the optimal range.

As is summarized in FIG. 11 in the process loop, the method for controlling a working condition of electronic devices 10 via controlling a climate parameter 50, e.g. the temperature of the electronic devices 10, comprises: (i) measuring a climate parameter distribution 51 by a sensor array 45 of climate sensors 44 arranged in vicinity of an array 12 of the electronic devices 10; (ii) feeding the climate parameter distribution 51 to a climate control system 120 and controlling by the climate control system 120, the climate parameter 50 by providing a controllable air flow 32, e.g., a fluid stream, of a cooling fluid towards the electronic devices 10.

The controllable fluid stream of the cooling fluid may be an air flow 32, controllable by variable supply fluid dampers 20, in particular supply air dampers 20, which supply the cooling fluid to the array 12 of electronic devices 10, in particular air inlets 17 in raised ground plates 16.

Further the method comprises (iii) obtaining operational data from the electronic devices 10, representing its working condition based on its workload, and based on the climate parameter 50 affecting the electronic device 10; (iv) feeding the operational data into the climate control system 120 to determine control actions 128 to be executed to control the working condition of the electronic devices 10 by controlling the climate parameter 50; (v) obtaining activity data about extrinsic factors 100 influencing the workload processed by the electronic devices 10; (vi) providing a machine learning algorithm trained with past activity data, thereby having learned to derive from the activity data the expectable workload for the electronic devices 10 being expectable in a predetermined time window 140 after the extrinsic factors 100; (vii) feeding new activity data to the machine learning algorithm, and obtaining from the machine learning algorithm a prediction output 138 regarding the expectable workload for the electronic devices 10, in a predetermined time window 140; (viii) feeding the prediction output 138 to the climate control system 120 as additional input for controlling the climate parameter 50 in the predetermined time window 140; (ix) generating a current climate map, the current climate map reflecting a climate profile across the array 12 of the electronic devices 10, obtained via the controlled climate parameters 50; (x) generating a target climate map 124, the target climate map 124 being obtainable via rearranging the electronic devices 10, where the target climate map 124 represents essentially the same workload with essentially the same climate conditions as the current climate map at a reduced power consumption over a predetermined second time window 140.

Figure 12:
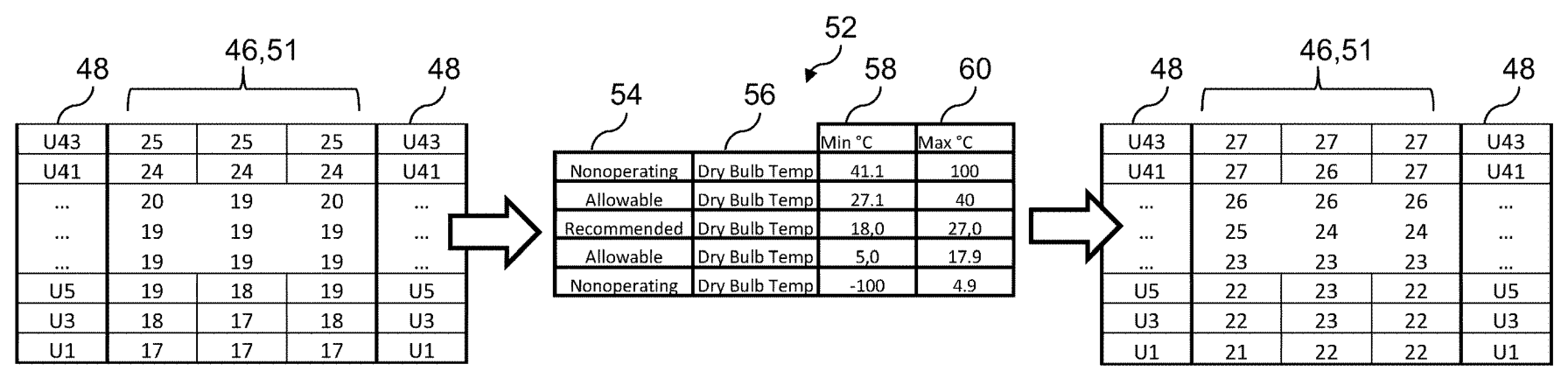

FIG. 12 depicts the process for changing the temperature distribution in the rack by changing the air inlets in the base plate according to an embodiment of the invention. Temperatures of the respective units are raised from values of 17° C., which is outside the recommended range of 18° C. to 27° C., to values above the lower limit of 18° C., which is depicted in the temperature distribution on the right-hand side of FIG. 12.

Advantageously the energy savings to be expected from less cooling energy result from the following facts:

The supply air volume flow adapted to the real load conditions of the electronic devices 10, which no longer necessarily must be set to the maximum cooling requirement.

The higher average exhaust air temperatures, which is conducive to more effective operation of the air conditioning unit.

The available sensor information, which covers the entire area to be monitored (e.g. a rack 14) as a network, makes it possible to record special error conditions that could not be detected without measured values or with only individual sensors. It can be recorded and recognized whether there is recirculation of warm exhaust air and where exactly these occur and influence the operation. The permanent collection and storage of the data makes it possible to learn normal states and to deduce from them what is an exceptional or unwanted state.

Through the extrinsic and intrinsic knowledge gained, errors or optimization potential in the layout or the execution of the assembly of devices or the correspondingly contained assortment can be recognized, this manufacturer agnostically.

Regardless of the manufacturer's specifications, the climate control system, according to an embodiment of the invention, may have learned from incident and configuration management data that certain installation positions have a positive or negative influence on the error rate and thus the system reliability, although this is not obvious despite compliance with the manufacturer's specifications. Smaller or larger changes in position can reduce maintenance and operating costs thanks to recommendations of the climate control system.

The learned information allows an assessment for possible optimizations. For example, to increase energy efficiency. The recommendation results in an optimized layout proposal. Based on this, a change in the location where the equipment is installed could be appropriate in order to achieve higher energy efficiency.

Therefore, it may be advantageous according to an embodiment of the invention (xi) to generate a rearrangement plan, comprising rearrangement steps for the electronic devices 10, required when starting from the current climate map to arrive at the target climate map 124. The rearrangement steps for the electronic devices 10 may be performed automatically, e.g., by a robot.

Figure 13:
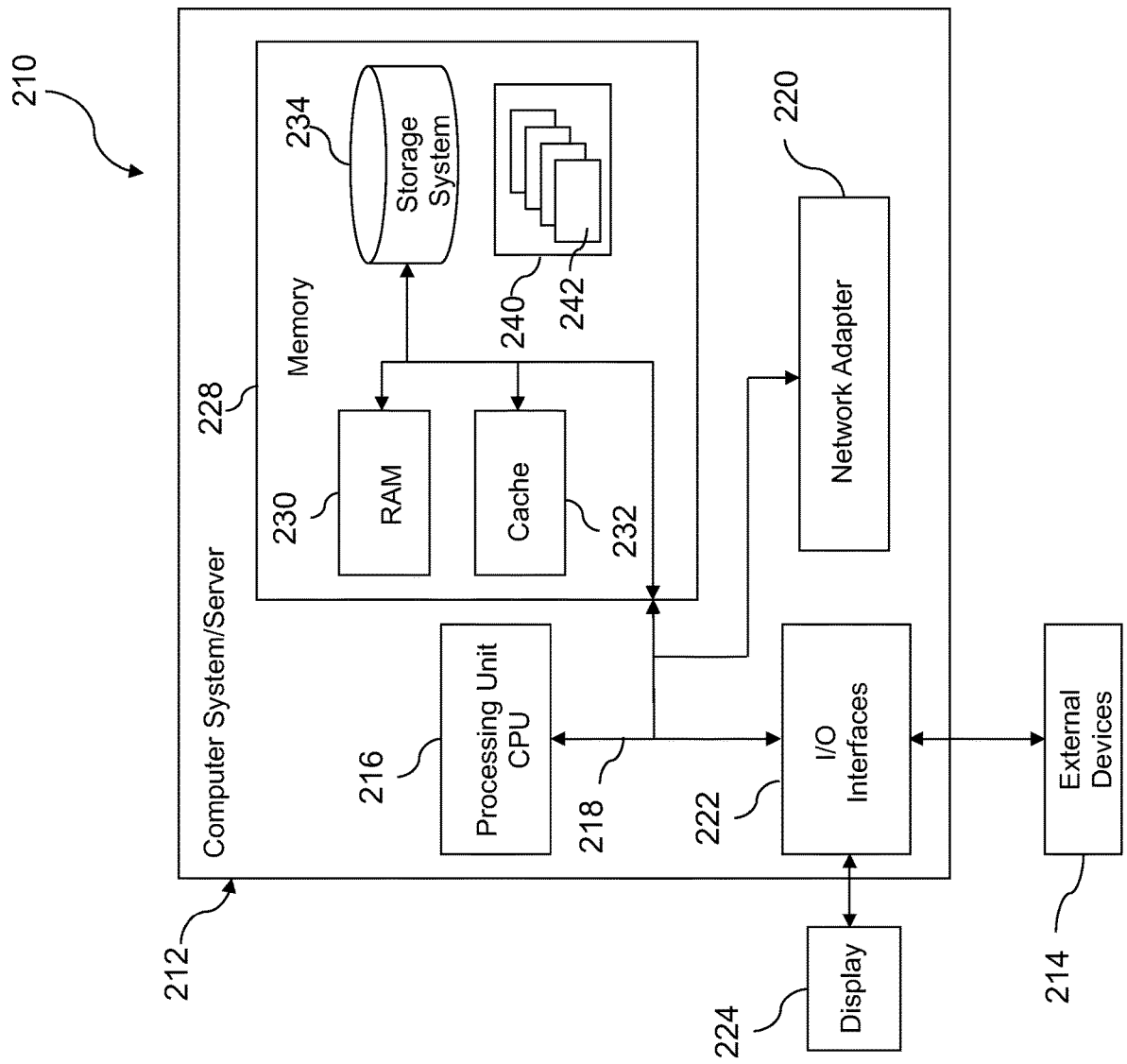
FIG. 13 depicts an example embodiment of a data processing system for executing a method according to the invention.

Referring now to FIG. 13, a schematic of an example of a data processing system 210 is shown. Data processing system 210 is only one example of a suitable data processing system and is not intended to suggest any limitation as to the scope of use or functionality of embodiments of the invention described herein. Regardless, data processing system 210 is capable of being implemented and/or performing any of the functionality set forth herein above.

In data processing system 210 there is a computer system/server 212, which is operational with numerous other general-purpose or special-purpose computing system environments or configurations. Examples of well-known computing systems, environments, and/or configurations that may be suitable for use with computer system/server 212 include, but are not limited to, personal computer systems, server computer systems, thin clients, thick clients, handheld or laptop devices, multiprocessor systems, microprocessor-based systems, set top boxes, programmable consumer electronics, network PCs, minicomputer systems, mainframe computer systems, and distributed cloud computing environments that include any of the above systems or devices, and the like.

Computer system/server 212 may be described in the general context of computer system executable instructions, such as program modules, being executed by a computer system. Generally, program modules may include routines, programs, objects, components, logic, data structures, and so on that perform particular tasks or implement particular abstract data types. Computer system/server 212 may be practiced in distributed cloud computing environments where tasks are performed by remote processing devices that are linked through a communications network. In a distributed cloud computing environment, program modules may be located in both local and remote computer system storage media including memory storage devices.

As shown in FIG. 13, computer system/server 212 in data processing system 210 is shown in the form of a general-purpose computing device. The components of computer system/server 212 may include, but are not limited to, one or more processors or processing units 216, a system memory 228, and a bus 218 that couples various system components including system memory 228 to processor 216.

Bus 218 represents one or more of any of several types of bus structures, including a memory bus or memory controller, a peripheral bus, an accelerated graphics port, and a processor or local bus using any of a variety of bus architectures. By way of example, and not limitation, such architectures include Industry Standard Architecture (ISA) bus, Micro Channel Architecture (MCA) bus, Enhanced ISA (EISA) bus, Video Electronics Standards Association (VESA) local bus, and Peripheral Component Interconnect (PCI) bus.

Computer system/server 212 typically includes a variety of computer system readable media. Such media may be any available media that is accessible by computer system/server 212, and it includes both volatile and non-volatile media, removable and non-removable media.

System memory 228 can include computer system readable media in the form of volatile memory, such as random access memory (RAM) 230 and/or cache memory 232. Computer system/server 212 may further include other removable/non-removable, volatile/non-volatile computer system storage media. By way of example only, storage system 234 can be provided for reading from and writing to a non-removable, non-volatile magnetic media (not shown and typically called a "hard drive"). Although not shown, a magnetic disk drive for reading from and writing to a removable, non-volatile magnetic disk (e.g., a "floppy disk"), and an optical disk drive for reading from or writing to a removable, non-volatile optical disk such as a CD-ROM, DVD-ROM or other optical media can be provided. In such instances, each can be connected to bus 218 by one or more data media interfaces. As will be further depicted and described below, memory 228 may include at least one program product having a set (e.g., at least one) of program modules that are configured to carry out the functions of embodiments of the invention.

Program/utility 240, having a set (at least one) of program modules 242, may be stored in memory 228 by way of example, and not limitation, as well as an operating system, one or more application programs, other program modules, and program data. Each of the operating system, one or more application programs, other program modules, and program data or some combination thereof, may include an implementation of a networking environment. Program modules 242 generally carry out the functions and/or methodologies of embodiments of the invention as described herein.

Computer system/server 212 may also communicate with one or more external devices 214 such as a keyboard, a pointing device, a display 224, etc.; one or more devices that enable a user to interact with computer system/server 212; and/or any devices (e.g., network card, modem, etc.) that enable computer system/server 212 to communicate with one or more other computing devices. Such communication can occur via Input/Output (I/O) interfaces 222. Still yet, computer system/server 212 can communicate with one or more networks such as a local area network (LAN), a general wide area network (WAN), and/or a public network (e.g., the Internet) via network adapter 220. As depicted, network adapter 220 communicates with the other components of computer system/server 212 via bus 218. It should be understood that although not shown, other hardware and/or software components could be used in conjunction with computer system/server 212. Examples, include, but are not limited to: microcode, device drivers, redundant processing units, external disk drive arrays, RAID systems, tape drives, and data archival storage systems, etc.

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general-purpose computer, special-purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special-purpose hardware-based systems that perform the specified functions or acts or carry out combinations of special-purpose hardware and computer instructions.

The descriptions of the various embodiments of the present invention have been presented for purposes of illustration but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method for controlling a working condition of electronic devices via controlling a climate parameter, the method comprising:
   measuring a climate parameter distribution by an array of climate sensors arranged in vicinity of an array of the electronic devices;
   feeding the climate parameter distribution to a climate control system and controlling by the climate control system the climate parameter by providing a controllable fluid stream of a cooling fluid towards the electronic devices;
   obtaining operational data from the electronic devices, representing working conditions based on workloads, and based on the climate parameter affecting the electronic devices;
   feeding the operational data into the climate control system to determine control actions to be executed to control the working condition of the electronic devices by controlling the climate parameter;
   obtaining activity data about external activities influencing the workload processed by the electronic devices;
   providing a machine learning algorithm trained with past activity data, thereby having learned to derive from the activity data an expectable workload for the electronic devices being expectable in a predetermined time window after the external activities;
   feeding new activity data to the machine learning algorithm, and obtaining from the machine learning algorithm a prediction output regarding the expectable workload for the electronic devices, in a predetermined time window;
   feeding the prediction output to the climate control system as additional input for controlling the climate parameter in the predetermined time window;
   generating a current climate map, the current climate map reflecting a climate profile across the array of the electronic devices, obtained via the controlled climate parameters;
   generating a target climate map, the target climate map being obtainable via rearranging the electronic devices, wherein the target climate map represents a workload and climate conditions matching the current climate map at a reduced power consumption over a predetermined second time window; and
   generating a rearrangement plan, comprising rearrangement steps for the electronic devices, required when starting from the current climate map to arrive at the target climate map.

2. The method according to claim 1, wherein the climate parameter represents an operating temperature of an electronic device.

3. The method according to claim 1, wherein the controllable fluid stream of the cooling fluid is an air flow, controllable by variable supply fluid dampers, in particular supply air dampers, supplying the cooling fluid to the array of electronic devices, in particular air inlets in raised ground floor plates.

4. The method according to claim 1, wherein the rearrangement steps are performed automatically, in particular by a robot.

5. The method according to claim 1, wherein the machine learning algorithm is based on a deep learning algorithm, in particular an adaptive deep learning algorithm.

6. The method according to claim 1, wherein the external activities comprise at least one of social media entries, news media, weather information, energy market data, stock exchange data.

7. The method according to claim 1, wherein the machine learning algorithm comprises an architecture for natural language processing for evaluating the external activities, in particular a Deep Belief Network.

8. The method according to claim 1, wherein the machine learning algorithm is trained with intrinsic factors, comprising at least one of a geographic location, a date, a timestamp, a sensor measured value, a sensor position, a fluid damper position, a configuration management, incident/problem management data, a vendor specification, an access management data, a house automation data or an industry type.

9. The method according to claim 1, wherein the climate parameter distribution is measured by providing climate sensors at different locations across the array of electronic devices, in particular in a mesh-like array of climate sensors.

10. The method according to claim 9, wherein the climate sensors are positioned on a front side of the array of electronic devices.

11. The method according to claim 1, wherein the climate sensors are at least one of a temperature sensor, a humidity sensor, an air flow sensor, an acoustic sensor, a vibration sensor, a gas sensor or a particle sensor.

12. The method according to claim 1, wherein pre-training the machine learning algorithm comprises a Restricted Boltzmann Machine.

13. The method according to claim 1, wherein fine-tuning the machine learning algorithm comprises a back-propagation algorithm.

14. The method according to claim 1, further comprising:
fetching intrinsic data and external data of data centers in one or more industries;
deducing at least one of intrinsic indicators or external indicators;
determining a time-lag between the indicators and climate changes;
correlating the indicators with the climate changes and applying the time-lag;
pre-training a prediction model associated with a Deep Belief Network using a Restricted Boltzmann Machine;
using the prediction model as initial input for a feed-forward neural network;
fine-tuning the prediction model using a back-propagation algorithm; and
verifying the prediction model by applying a test dataset.

15. The method according to claim 1, further comprising:
determining at least one of anomalies in the working condition or failures of the electronic devices by evaluating a measured climate parameter distribution.

16. The method according to claim 1, wherein a measured climate parameter distribution is continuously compared with manufacturer specifications of the electronic devices.

17. The method according to claim 1, further comprising:
determining at least one of failure probabilities or a temperature prediction for an array of electronic devices using one or a multitude of pre-trained Deep Belief Networks.

18. The method according to claim 1, wherein at least one of fluid dampers are controlled pro-actively or an alarm is raised, depending on at least one of failure probabilities, a temperature prediction, a target temperature or an alarm threshold.

19. A computer program product for controlling a working condition of electronic devices via controlling a climate parameter, the computer program product comprising:
a computer readable storage medium having program instructions embodied therewith, the program instructions executable by a computer system to cause the computer system to perform a method comprising:
measuring climate parameters by an array of climate sensors arranged in vicinity of an array of the electronic devices;
feeding the climate parameters to a climate control system and controlling, by the climate control system, the climate parameters by providing a controllable fluid stream of a cooling fluid towards the electronic devices;
obtaining operational data from the electronic devices, representing working conditions based on workloads, and based on the climate parameters affecting the electronic devices;
feeding the operational data into the climate control system to determine control actions to be executed to control the working condition of the electronic devices by controlling the climate parameters;
obtaining activity data about external activities influencing the workload processed by the electronic devices;
providing a machine learning algorithm trained with past activity data, thereby having learned to derive from the activity data expectable workloads for the electronic devices being expectable in a predetermined time window after external activity;
feeding new activity data to the machine learning algorithm, and obtaining from the machine learning algorithm a prediction output regarding the expectable workload for the electronic devices, in a predetermined time window;
feeding the prediction output to the climate control system as additional input for controlling the climate parameters in the predetermined time window;
generating a current climate map, the current climate map reflecting a climate profile across the array of the electronic devices, obtained via the climate parameters;
generating a target climate map, the target climate map being obtainable via rearranging the electronic devices, wherein the target climate map represents workloads with climate conditions matching the current climate map at a reduced power consumption over a predetermined second time window; and
generating a rearrangement plan, comprising rearrangement steps for the electronic devices, required when starting from the current climate map to arrive at the target climate map.

20. A data processing system for execution of a data processing program comprising computer readable program instructions for performing a method according to claim 1.

* * * * *